(12) United States Patent
Ogiwara et al.

(10) Patent No.: US 9,412,449 B2
(45) Date of Patent: Aug. 9, 2016

(54) SEMICONDUCTOR STORAGE DEVICE

(71) Applicant: Kabushiki Kaisha Toshiba, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/882,915

(22) Filed: Oct. 14, 2015

(65) Prior Publication Data

US 2016/0180930 A1 Jun. 23, 2016

Related U.S. Application Data

(60) Provisional application No. 62/095,362, filed on Dec. 22, 2014.

(51) Int. Cl.
*G11C 13/00* (2006.01)

(52) U.S. Cl.
CPC ........ *G11C 13/0069* (2013.01); *G11C 13/0004* (2013.01)

(58) Field of Classification Search
CPC ............. G11C 13/004; G11C 2213/72; G11C 2013/009; G11C 2013/0073; G11C 2213/56; G11C 7/18; G11C 2213/55; H01L 45/06
See application file for complete search history.

(56) References Cited

U.S. PATENT DOCUMENTS

| 7,688,614 | B2 | 3/2010 | Morimoto |
| 8,045,362 | B2 | 10/2011 | Maejima |
| 8,724,371 | B2 | 5/2014 | Inoue |
| 9,093,144 | B2 | 7/2015 | Kanno et al. |
| 2012/0044733 | A1* | 2/2012 | Scheuerlein ........... B82Y 10/00 365/51 |

FOREIGN PATENT DOCUMENTS

| JP | 2007-164925 | 6/2007 |
| JP | 2009-140593 | 6/2009 |

(Continued)

OTHER PUBLICATIONS

Junji Tominaga et al. "Electrical-Field Induced Giant Magnetoresitivity in (Non-Magnetic) Phase Change Films", Applied Physics Letters, vol. 99, 2011, 4 pages.

(Continued)

*Primary Examiner* — Harry W Byrne
*Assistant Examiner* — Ajay Ojha
(74) *Attorney, Agent, or Firm* — Oblon, McClelland, Maier & Neustadt, L.L.P.

(57) ABSTRACT

A semiconductor storage device according to an embodiment comprises a plurality of column power supply lines and a plurality of row power supply lines. A plurality of resistance-change memory cells are connected to the column power supply lines and the row power supply lines, respectively. A first column driver supplies a current to a first column power supply line among the column power supply lines. A second column driver supplies a current to a second column power supply line among the column power supply lines. In a data write operation, the first and second column drivers apply voltages having opposite polarities to the first and second column power supply lines, respectively. One of the first and second column drivers supplies a current to relevant ones of the memory cells and other thereof receives the current having passed through the memory cells.

20 Claims, 8 Drawing Sheets

(56) References Cited

FOREIGN PATENT DOCUMENTS

| | | |
|---|---|---|
| JP | 2010-33676 | 2/2010 |
| JP | 2014-146406 | 8/2014 |

OTHER PUBLICATIONS

J. Tominaga et al. "The First Principle Computer Simulation and Real Device Characteristics of Superlattice Phase-Change Memory", Electron Devices Meeting (IEDM), 2010 IEEE International, 2010, 4 pages.

Ching-Hua Wang et al. "Three-Dimensional $4F^2$ ReRAM with Vertical BJT Driver by CMOS Logic Compatible Process", IEEE Transactions on Electron Devices, vol. 58, No. 8, Aug. 2011, 7 pages.

Lisa L. Wang et al. "Analytical Drain Current Model for Poly-Si Thin-Film Transistors Biased in Strong Inversion Considering Degradation of Tail States at Grain Boundary", IEEE Transactions on Electron Devices, vol. 60, No. 3, Mar. 2013, 6 pages.

\* cited by examiner

SEMICONDUCTOR STORAGE DEVICE

CROSS REFERENCE TO RELATED APPLICATIONS

This application is based upon and claims the benefit of priority from the prior US Provisional Patent Application No. 62/095,362, filed on Dec. 22, 2014, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacity. Development of memories using new materials is progressing to achieve further downscaling. Novel memories such as a resistance random access memory (ReRAM), a phase-change RAM (PRAM), a phase-change memory (PCM), an interfacial PCM (iPCM), a ferroelectric NAND-type memory (FeNAND), and a magnetic random access memory (MRAM) are developed.

Among these novel memories, the PCM and the iPCM are brought to a low resistance state (a Set state) or a high resistance state (a Reset state) according to phase transition of a phase-change film of the relevant memory cell. This enables the PCM and the iPCM to store therein logical data.

In such a resistance-change memory, data is written to a memory cell by supplying a current and a voltage to the memory cell. Therefore, the distance (the length of interconnection) from a read/write circuit on the current supply side or a source line driver on the current sink side to a memory cell affects the voltage applied to the memory cell. For example, when a bit line from the read/write circuit to a memory cell or a source line from the memory cell to the source line driver (a current sink) is relatively short, a voltage drop or a voltage increase (voltage floating) caused by interconnection is small. Accordingly, a sufficiently-large write voltage difference can be applied to the memory cell. On the other hand, when a bit line from the read/write circuit to a memory cell and a source line from the memory cell to the source line driver (the current sink) is long, a voltage drop or a voltage increase caused by interconnection becomes large. Accordingly, a voltage difference applied to the memory cell becomes relatively small. In this case, there is a risk that data cannot be written to the memory cell.

As described above, in the conventional resistance-change memory, there are cases where a sufficiently-large write voltage cannot be applied to a memory cell depending on the position of the memory cell in a memory cell array.

DETAILED DESCRIPTION

Embodiments will now be explained with reference to the accompanying drawings. The present invention is not limited to the embodiments.

A semiconductor storage device according to an embodiment comprises a plurality of column power supply lines and a plurality of row power supply lines. A plurality of resistance-change memory cells are connected to the column power supply lines and the row power supply lines, respectively. A first column driver supplies a current to a first column power supply line among the column power supply lines. A second column driver supplies a current to a second column power supply line among the column power supply lines. In a data write operation, the first and second column drivers apply voltages having opposite polarities to the first and second column power supply lines, respectively. One of the first and second column drivers supplies a current to relevant ones of the memory cells and other thereof receives the current having passed through the memory cells.

Embodiments described below are applicable to any one of current-detection memories such as a ReRAM, a PRAM, a PCM, an iPCM, a FeNAND, and an MRAM.

First Embodiment

Figure 1:
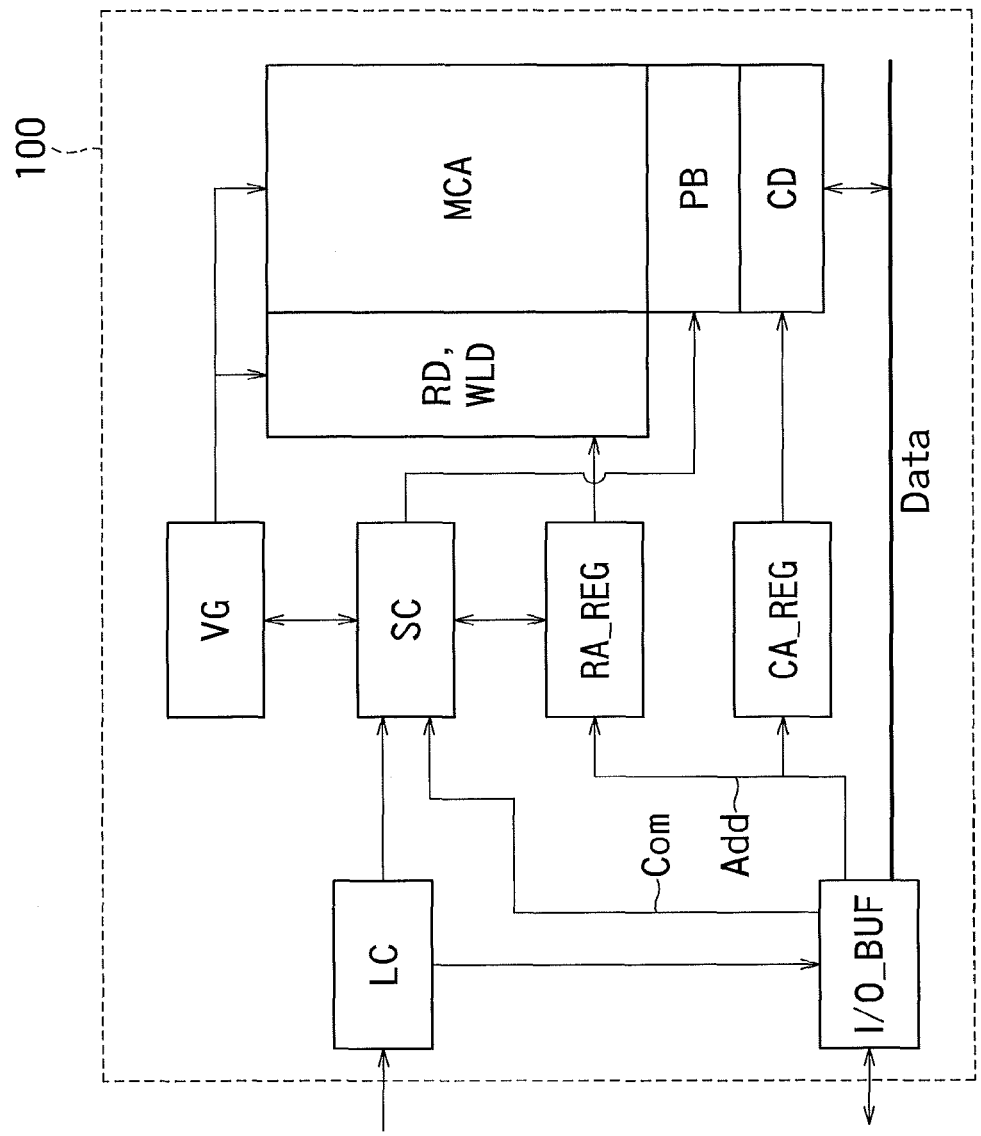
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD, a row decoder RD, an internal-voltage generation circuit VG, a sequence controller SC, a logic controller LC, a row address register RA_REG, a column address register CA_REG, and an input/output (I/O) buffer I/O_BUF. The internal-voltage generation circuit VG includes a step-up circuit that generates a step-up potential higher than that of an external power supply VDD with a charge pump circuit, a source-follower step-down transistor, a circuit that generates an internal step-down potential from that of the external power supply VDD with a PMOS (P-type Metal-Oxide-Semiconductor) feedback circuit, a BGR (Band-Gap-Reference) circuit serving as a reference-potential generation circuit that generates a constant potential regardless of temperatures and power supply voltages, a power-on detection circuit that detects rising of the external power supply potential to a value equal to or larger than a certain value, and the like (not shown). In FIG. 1, the step-up potential is supplied to the memory cell array MCA, the row decoder RD, and the word line driver WLD. The step-down potential is supplied to the page buffer PB, the column decoder CD, the sequence controller SC, the row address register RA_REG, and the column address register CA_REG.

The memory cell array MCA includes a plurality of memory cells MC arranged two-dimensionally or three-dimensionally. The row decoder RD and the word line driver WLD selectively step up or drive one of word lines of the memory cell array MCA.

The column decoder CD and the page buffer PB read data of a memory cell MC via a selected bit line or bit line pair and temporarily store therein the read data. The column decoder CD and the page buffer PB also function as a bit line driver and temporarily store therein write data to write the write data to a memory cell MC via a selected bit line or bit line pair. The page buffer PB includes a sense amplifier circuit and a data retention circuit and performs read and write of data in units of pages of the memory cell array MCA.

The row address register RA_REG receives a row address signal via the I/O buffer I/O_BUF and retains the row address signal therein. The column address register CA_REG receives a column address signal via the I/O buffer I/O_BUF and retains the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (the read data or the write data). A read operation or a write operation is performed according to the command Com. Upon receipt of the command Com, the sequence controller SC performs a sequence control on read, write, or erase.

The internal-voltage generation circuit VG is controlled by the sequence controller SC and generates or supplies predetermined voltages required for various operations.

The I/O buffer I/O_BUF outputs the read data from the column decoder CD to outside or transfers the write data from outside to the column decoder CD. The I/O buffer I/O_BUF receives the command Com and the address signal Add.

Figure 2:
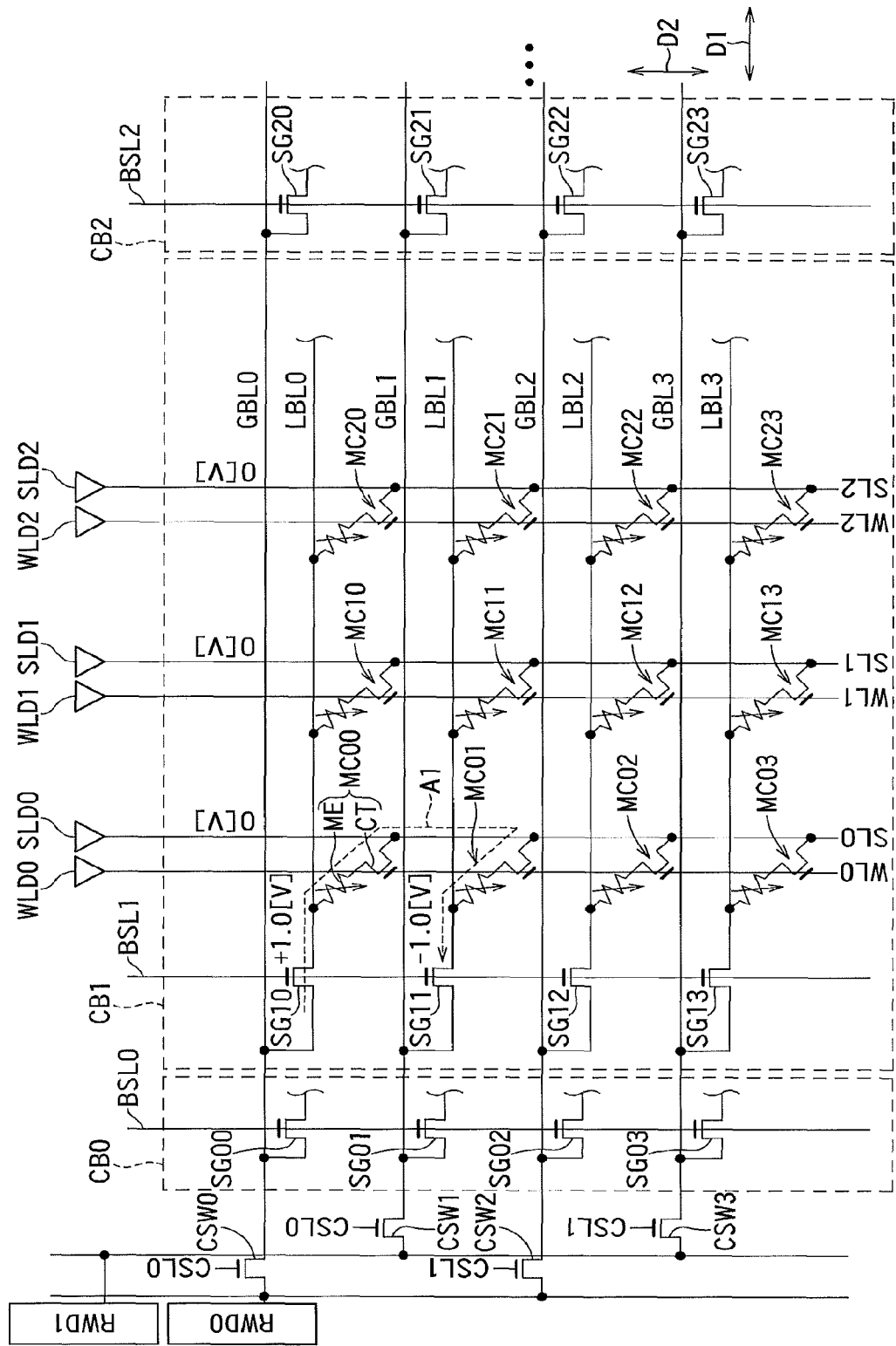
FIG. 2 shows a configuration example of the memory cell array MCA of the memory 100 and a peripheral part thereof according to the first embodiment.

FIG. 2 shows a configuration example of the memory cell array MCA of the memory 100 and a peripheral part thereof according to the first embodiment. The memory cell array MCA includes cell blocks CB0 to CB2. The cell blocks CB0 to CB2 have the same configuration. In FIG. 2, an internal configuration of the cell block CB1 is shown and illustration of internal configurations of other cell blocks CB0 and CB2 is omitted. The number of cell blocks in each memory cell array MCA, and the numbers of memory cells, word lines, bit lines, and source lines in each cell block can be arbitrarily set and are not particularly limited.

The cell block CB1 includes a plurality of memory cells MC00 to MC23. The memory cells MC00 to MC23 are arrayed two-dimensionally in a column direction D1 and a row direction D2 in a matrix. Each of the memory cells MC00 to MC23 includes a cell transistor CT and a memory element ME. The cell transistor CT and the memory element ME are connected in series between one of local bit lines LBL0 to LBL3 and one of source lines SL0 to SL2. The memory element ME is a resistance-change PCM or iPCM element. A gate of the cell transistor CT is connected to one of word lines WL0 to WL2. The memory cells MC00 to MC23 are thus provided to correspond to intersections between the local bit lines LBL0 to LBL3 and the word lines WL0 to WL2 (the source lines SL0 to SL2), respectively.

The local bit lines LBL0 to LBL3 serving as column power supply lines extend in the column direction D1 and are arrayed in the row direction D2. The word lines WL0 to WL3 extend in the row direction D2 and are arrayed in the column direction D1. The source lines SL0 to SL2 serving as row power supply lines extend in the row direction D2 and are arrayed in the column direction D1. The source lines SL0 to SL2 are provided to correspond to the word lines WL0 to WL2, respectively. The local bit lines LBL0 to LBL3 are orthogonal to the word lines WL0 to WL2 (the source lines SL0 to SL2).

Global bit lines GBL0 to GBL3 extend in the column direction D1 and are arrayed in the row direction D2. Each of the global bit lines GBL0 to GBL3 is shared by the cell blocks CB0 to CB2 and is provided to correspond to respective ones of the local bit lines LBL0 to LBL2 of the cell blocks CB0 to CB2. The global bit lines GBL0 to GBL3 are connected to the corresponding local bit lines LBL0 to LBL3 via corresponding ones of select gates SG00 to SG23 in the cell blocks CB0 to CB2.

The select gates SG00 to SG23 are controlled by block select lines BSL0 to BSL2 to be on/off. For example, when the cell block CB1 is to be selected, the block select line BSL1 brings the select gates SG10 to SG13 to an on-state. This connects the local bit lines LBL0 to LBL3 of the cell block CB1 to the global bit lines GBL0 to GBL3, respectively. At this time, the block select lines BSL0 and BSL2 are not driven and thus the select gates SG00 to SG03 and SG20 to SG23 are in an off-state. Therefore, the local bit lines of the cell blocks CB0 and CB2 are kept disconnected from the global bit lines GBL0 to GBL3, respectively. In this way, the block select lines BSL0 to BSL2 and the select gates SG00 to SG23 selectively connect any of the local bit lines of the cell blocks CB0 to CB2 to corresponding one of the global bit lines GBL0 to GBL3. The global bit lines GBL0 to GBL3 are connected via column select switches CSW0 to CSW3, respectively, to a read/write driver RWD0 or a read/write driver RWD1.

The read/write driver RWD0 serving as a first column driver is connected in common to drains of the column select switches CSW0 and CSW2 and supplies a current and a voltage to the global bit lines GBL0 and GBL2 via the column select switches CSW0 and CSW2, respectively.

The read/write driver RWD1 serving as a second column driver is connected in common to drains of the column select switches CSW1 and CSW3 and supplies a current and a voltage to the global bit lines GBL1 and GBL3 via the column select switches CSW1 and CSW3, respectively.

The column select switches CSW0 and CSW1 are controlled by a signal of the same column select line CSL0 to be on/off. Therefore, when a signal of the column select line CSL0 rises, the read/write drivers RWD0 and RWD1 are connected to the global bit lines GBL0 and GBL1 and supply power thereto, respectively. At this time, when the cell block CB1 is selected, the read/write drivers RWD0 and RWD1 are connected to the local bit lines LBL0 and LBL1 via the global bit lines GBL0 and GBL1 and supply power thereto, respectively.

The column select switches CSW2 and CSW3 are controlled by the same column select signal CSL1 to be turned on/off. Therefore, when the column select signal CSL1 rises, the read/write drivers RWD0 and RWD1 are connected to the global bit lines GBL2 and GBL3 and supply power thereto, respectively. At this time, when the cell block CB1 is selected, the read/write drivers RWD0 and RWD1 are connected to the local bit lines LBL2 and LBL3 via the global bit lines GBL2 and GBL3 and supply power thereto, respectively.

In this way, the read/write drivers RWD0 and RWD1 supply power to a pair of adjacent global bit lines (GBL0 and GBL1, for example) or a pair of adjacent local bit lines (LBL0 and LBL1, for example), respectively. Furthermore, the read/ write drivers RWD0 and RWD1 can apply different voltages to the pair of global bit lines and the pair of the local bit lines, respectively. For example, the read/write driver RWD0 applies a positive voltage to the local bit line LBL0 via the global bit line GBL0 while the read/write driver RWD1 can apply a negative voltage to the local bit line LBL1 via the global bit line GBL1.

Word line drivers WLD0 to WLD2 serving as row drivers are provided to correspond to the word lines WL0 to WL2 and can apply voltages to the word lines WL0 to WL2, respectively. Source line drivers SLD0 to SLD2 are provided to correspond to the source lines SL0 to SL2 and can apply voltages to the source lines SL0 to SL2, respectively.

A data write operation of the memory 100 according to the first embodiment is explained next. In the first embodiment, a pair of two memory cells MC instead of one memory cell MC stores therein one piece of data. That is, the memory 100 according to the first embodiment adopts a 2-cell/bit system rather than a 1-cell/bit system.

For example, when the memory 100 writes data to the memory cells MC00 and MC01 in the cell block CB1, the block select line BSL1 and the column select line CSL0 are selectively driven. Accordingly, the local bit lines LBL0 to LBL3 of the cell block CB1 are connected to the global bit lines GBL0 to LBL3, respectively. The read/write drivers RWD0 and RWD1 are connected to the global bit lines GBL0 and GBL1, respectively.

Furthermore, when the word line driver WLD0 selectively raises the word line WL0, the memory element ME of the memory cell MC00 is connected between the local bit line LBL0 and the source line SL0. Accordingly, the memory element ME of the memory cell MC01 is connected between the local bit line LBL1 and the source line SL0. The source line driver SLD0 keeps the source line SL0 at a reference voltage (0 volt, for example).

At this time, the read/write drivers RWD0 and RWD1 apply voltages having opposite polarities and being substantially equal in the absolute values to the local bit lines LBL0 and LBL1, respectively. The read/write driver RWD0 applies, for example, +1.0 volt to the local bit line LBL0. The read/write driver RWD1 applies, for example, −1.0 volt to the local bit line LBL1.

This causes a write current from the read/write driver RWD0 to flow to the memory cell MC00 via the global bit line GBL0 and the local bit line LBL0 as shown by an arrow A1 in FIG. 2. The write current further flows through the memory cell MC01 via the source line SL0 and flows in the read/write driver RWD1 via the local bit line LBL1 and the global bit line GBL1. That is, the read/write driver RWD0 supplies a current to the memory cells MC00 and MC01 and the read/write driver RWD1 receives the current having passed through the memory cells MC00 and MC01.

This flow of the write current causes a voltage to be applied to both of the memory cells MC00 and MC01 and the same data to be written to the pair of the memory cells MC00 and MC01.

Similarly, when the local bit lines LBL0 and LBL1 and the word line WL1 are selected, data is written to a pair of the memory cells MC10 and MC11. When the local bit lines LBL0 and LBL1 and the word line WL2 are selected, data is written to a pair of the memory cells MC20 and MC21.

Furthermore, when the column select line CSL1 is selected, the read/write drivers RWD0 and RWD1 are connected to the global bit lines GBL2 and GBL3, respectively. This enables the read/write drivers RWD0 and RWD1 to supply power to the local bit lines LBL2 and LBL3 via the global bit lines GBL2 and GBL3, respectively. In this case, data can be written to a pair of the memory cells MC02 and MC03, a pair of the memory cells MC12 and MC13, or a pair of the memory cells MC22 and MC23.

As described above, the memory 100 according to the first embodiment can write data to pairs of memory cells adjacent in the row direction D2, respectively.

According to the first embodiment, when data is to be written to, for example, a pair of the memory cells MC00 and MC01, voltages having opposite polarities and being substantially equal in the absolute values are applied to the local bit lines LBL0 and LBL1, respectively. That is, a voltage difference (+1.0 volt in the above example) between the local bit line LBL0 and the source line SL0 has the opposite polarity to that of a voltage difference (−1.0 volt in the above example) between the local bit line LBL1 and the source line SL0 and is substantially equal thereto in the absolute value. Therefore, the write current only passes through an interconnection portion between the memory cell MC00 and the memory cell MC01 in the source line SL0.

Further, when data is to be written to, for example, the memory cells MC22 and MC23, voltages having opposite polarities and being substantially equal in the absolute values are applied to the local bit lines LBL2 and LBL3, respectively. That is, a voltage difference between the local bit line LBL2 and the source line SL2 has the opposite polarity to that of a voltage difference between the local bit line LBL3 and the source line SL2 and is substantially equal thereto in the absolute value. Therefore, the write current only passes through an interconnection portion between the memory cell MC22 and the memory cell MC23 in the source line SL2.

Therefore, voltage drops or voltage increases caused by the source lines SL0 to SL2 are substantially equal between at the memory cells MC00 and MC01 and at the memory cells MC22 and MC23. The same holds true for other pairs of memory cells in the cell block CB1. That is, in the first embodiment, voltage drops or voltage increases caused by the source lines SL0 to SL2 are substantially uniform regardless of the positions of the memory cells in the cell block CB1.

For example, in a case where one of bit lines and one of source lines are selected and a write current is caused to flow in one memory cell between the bit line and the source line (in a case of a 1-cell/bit system), a read/write driver and a source line driver can apply a sufficiently-high voltage difference to a memory cell (MC00, for example) relatively close to the read/write driver and the source line driver. However, a voltage difference applied to a memory cell (MC23, for example) relatively distant from the read/write driver and the source line driver is relatively small due to a voltage drop caused by an interconnection resistance of the corresponding bit line or a voltage increase (voltage floating) caused by an interconnection resistance of the corresponding source line. In this case, there is a risk that data cannot be written to a memory cell relatively distant from the read/write driver and the source line driver while data can be sufficiently written to a memory cell relatively close to the read/write driver and the source line driver.

On the other hand, according to the first embodiment, voltage increases (voltage floating) caused by the source lines SL0 to SL2 are quite small and substantially uniform regardless of the positions of the memory cells MC00 to MC23 in the cell block CB1 as described above. Therefore, while there are still influences of voltage drops due to the interconnection resistances of the local bit lines LBL0 to LBL3, the voltage increases caused by the source lines SL0 to SL2 are suppressed. Accordingly, the memory 100 according to the first embodiment can reduce differences in the write voltage depending on the positions of the memory cells MC00 to MC23 in the cell blocks CB0 to CB2. As a result, the memory 100 can write data to the memory cells more reliably.

In a writing method according to the first embodiment, one piece of data is stored in a pair of memory cells. Therefore, the first embodiment is more suitable for a method of writing data in units of cell blocks or columns, such as block reset and block set or column reset and column set, than for a random-access writing method.

Figure 3:
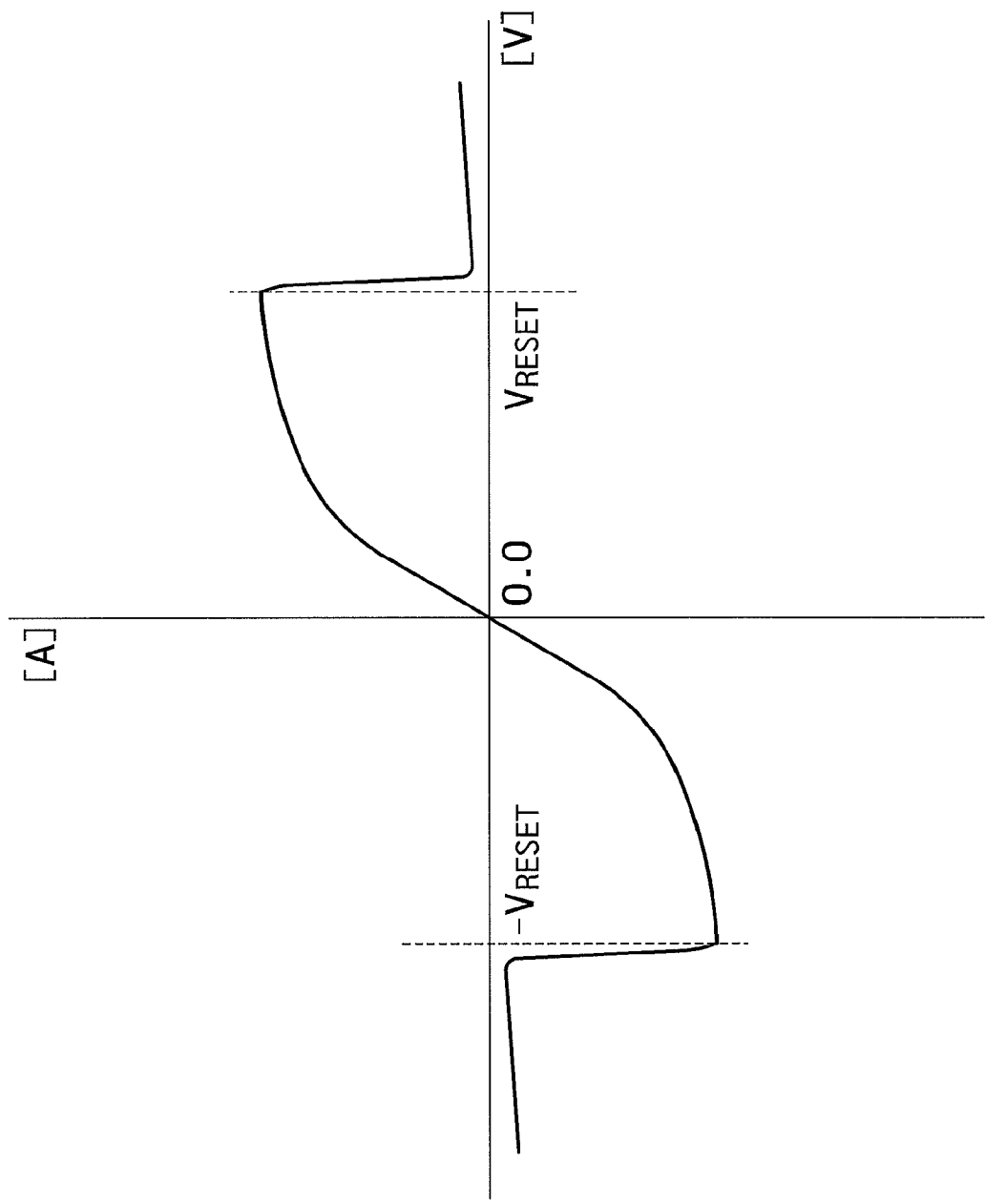
FIG. 3 is a graph showing the current and the voltage to be supplied to a memory cell to write the Reset state thereto.

In the above example, the direction of current supply and the direction of voltage application to the memory cell MC00 are opposite to those to the memory cell MC01. However, the PCM and iPCM are brought to the same resistance state (the Reset state or the Set state) even when the current supply direction and the voltage application direction are reverse. For example, FIG. 3 is a graph showing the current and the voltage to be supplied to a memory cell to write the Reset state (high-resistance state) thereto. The vertical axis represents the current flowing in the memory cell and the horizontal axis represents the voltage applied to the memory cell. As shown in the graph of FIG. 3, when a voltage and a current are supplied to a memory cell in the Set state and the voltage applied to the memory cell exceeds $\pm V_{RESET}$, the phase of the memory cell transitions to the Reset state. That is, the Reset state is written to the memory cell when the absolute value of the voltage exceeds $|V_{RESET}|$ regardless of the directions of the current and the voltage supplied to the memory cell. When the Set state is to be written, it suffices to similarly set the absolute value of the voltage applied to the memory cell at $|V_{SET}|$ or larger. However, the absolute values of the write voltage, the application speed or decrease speed of the write voltage, and the like are different between write of the Reset state and write of the Set state.

Data can be written to the memory cells MC00 to MC23 regardless of the directions of current supply and the directions of voltage application to the memory cells MC00 to MC23. Therefore, the read/write driver RWD1 can supply a current to the memory cell MC00 and MC01 and the read/write driver RWD0 can receive the current having passed through the memory cells MC00 and MC01. Even with this configuration, the effects of the first embodiment are not lost.

Second Embodiment

In a second embodiment, the word line drivers WLD0 to WLD2 shown in FIG. 2 select the word lines WL0 to WL2 in turn in time series to write data to the memory cells MC00 to MC23 connected to the word lines WL0 to WL2 in turn. The memory configuration of the second embodiment can be identical to that of the memory 100 according to the first embodiment.

For example, in a state where the read/write drivers RWD0 and RWD1 supply currents and voltages to the local bit lines LBL0 and LBL1, respectively, the word line drivers WLD0 to WLD2 drive pairs of word lines in turn in time series. More specifically, data is written to a pair of the memory cells MC00 and MC01 when the word line WL0 is first selected, then data is written to a pair of the memory cells MC10 and MC11 when the word line WL1 is selected, and then data is written to a pair of the memory cells MC20 and MC21 when the word line WL2 is selected. In this way, the word lines WL0 to WL2 are selected in turn in time series in units of pairs of adjacent word lines and data is written to memory cells connected to the selected pair of word lines.

The memory 100 according to the second embodiment can bring all pairs of memory cells in the same column connected to the local bit lines LBL0 and LBL1 to the Reset state or the Set state one after another. That is, the memory 100 does not need to change a connection relation of the read/write drivers RWD0 and RWD1, the global bit lines GBL0 and GBL1, and the local bit lines LBL0 and LBL1 until write to all pairs of the memory cells in the same column is completed.

When data is to be written to pairs of memory cells in another column, it suffices that the memory 100 changes the connection relation of the read/write drivers RWD0 and RWD1, the global bit lines GBL0 and GBL1, and the local bit lines LBL0 and LBL1. This enables the memory 100 to write the Reset state or the Set state to the memory cells MC00 to MC23 in the cell block CB1 in a short time.

Operations of the memory according to the second embodiment other than those described above can be identical to corresponding operations of the memory 100 according to the first embodiment. Therefore, the second embodiment can also achieve effects of the first embodiment.

Third Embodiment

In a third embodiment, the word line drivers WLD0 to WLD2 shown in FIG. 2 select the word lines WL0 to WL2 at the same time to write data to the memory cells MC00 to MC23 connected to the word lines WL0 to WL2 at the same time. The memory configuration of the third embodiment can be identical to that of the memory 100 according to the first embodiment.

For example, in a state where the read/write drivers RWD0 and RWD1 supply currents and voltages to the local bit lines LBL0 and LBL1, respectively, the word line drivers WLD0 to WLD2 drive the word lines WL0 to WL2 at the same time. This enables the memory 100 to bring all pairs of memory cells in the same column connected to the local bit lines LBL0 and LBL1 to the Reset state or the Set state at the same time.

When data is to be written to pairs of memory cells in another column, it suffices that the memory 100 changes the connection relation of the read/write drivers RWD0 and RWD1, the global bit lines GBL0 and GBL1, and the local bit lines LBL0 and LBL1. In this way, the memory 100 can write the Reset state or the Set state to the memory cells MC00 to MC23 in the cell block CB1 in a shorter time.

Operations of the memory according to the third embodiment other than those described above can be identical to corresponding operations of the memory 100 according to the first embodiment. Therefore, the third embodiment can also achieve effects of the first embodiment.

Fourth Embodiment

Figure 4:
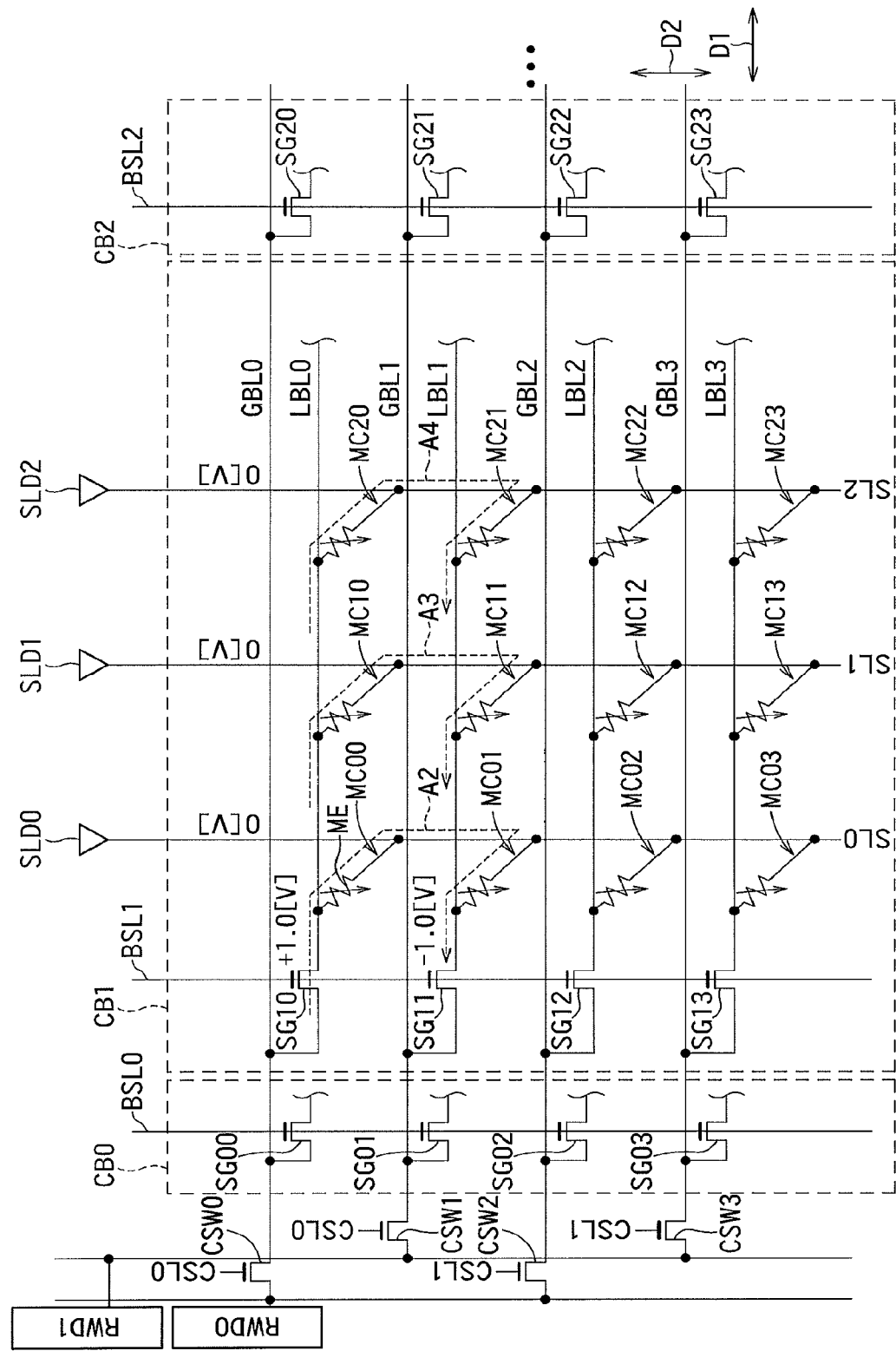
FIG. 4 shows a configuration example of the memory cell array MCA of a memory 100 and a peripheral part thereof according to a fourth embodiment.

FIG. 4 shows a configuration example of the memory cell array MCA of a memory 100 and a peripheral part thereof according to a fourth embodiment. The memory cells MC00 to MC23 according to the fourth embodiment do not have transistors, respectively. Therefore, the word lines WL0 to WL2 and the word line drivers WLD0 to WLD2 are omitted and the memory elements ME are connected directly between the local bit lines LBL0 to LBL3 and the source lines SL0 to SL2, respectively. Other configurations of the fourth embodiment can be identical to corresponding configurations of the first embodiment.

For example, when the read/write drivers RWD0 and RWD1 supply currents and voltages to the local bit lines LBL0 and LBL1, respectively, the currents simultaneously flow in all pairs of memory cells in the same column connected to the local bit lines LBL0 and LBL1 as shown by arrows A2 to A4 in FIG. 4. Accordingly, the memory 100 can simultaneously bring the all pairs of memory cells in the same column connected to the local bit lines LBL0 and LBL1 to the Reset state or the Set state.

When data is to be written to pairs of memory cells in another column, it suffices that the memory 100 changes the connection relation of the read/write drivers RW0 and RWD1, the global bit lines GBL0 and GBL1, and the local bit lines LBL0 and LBL1. This enables the memory 100 to write the Reset state or the Set state to the memory cells MC00 to MC23 in the cell block CB1 in a short time.

In this way, when all pairs of memory cells in the same column are to be brought to the Reset state or the Set state, the cell transistors CT, the word lines WL0 to WL2, and the word line drivers WLD0 to WLD2 can be omitted as in the fourth embodiment. As a result, the fourth embodiment can perform operations identical to those in the third embodiment and can further reduce the circuit scale of the memory cell array MCA as compared to that in the third embodiment.

Operations of the fourth embodiment other than those described above can be identical to corresponding operations of the first embodiment. Therefore, the fourth embodiment can also achieve effects of the first embodiment.

Fifth Embodiment

Figure 5:
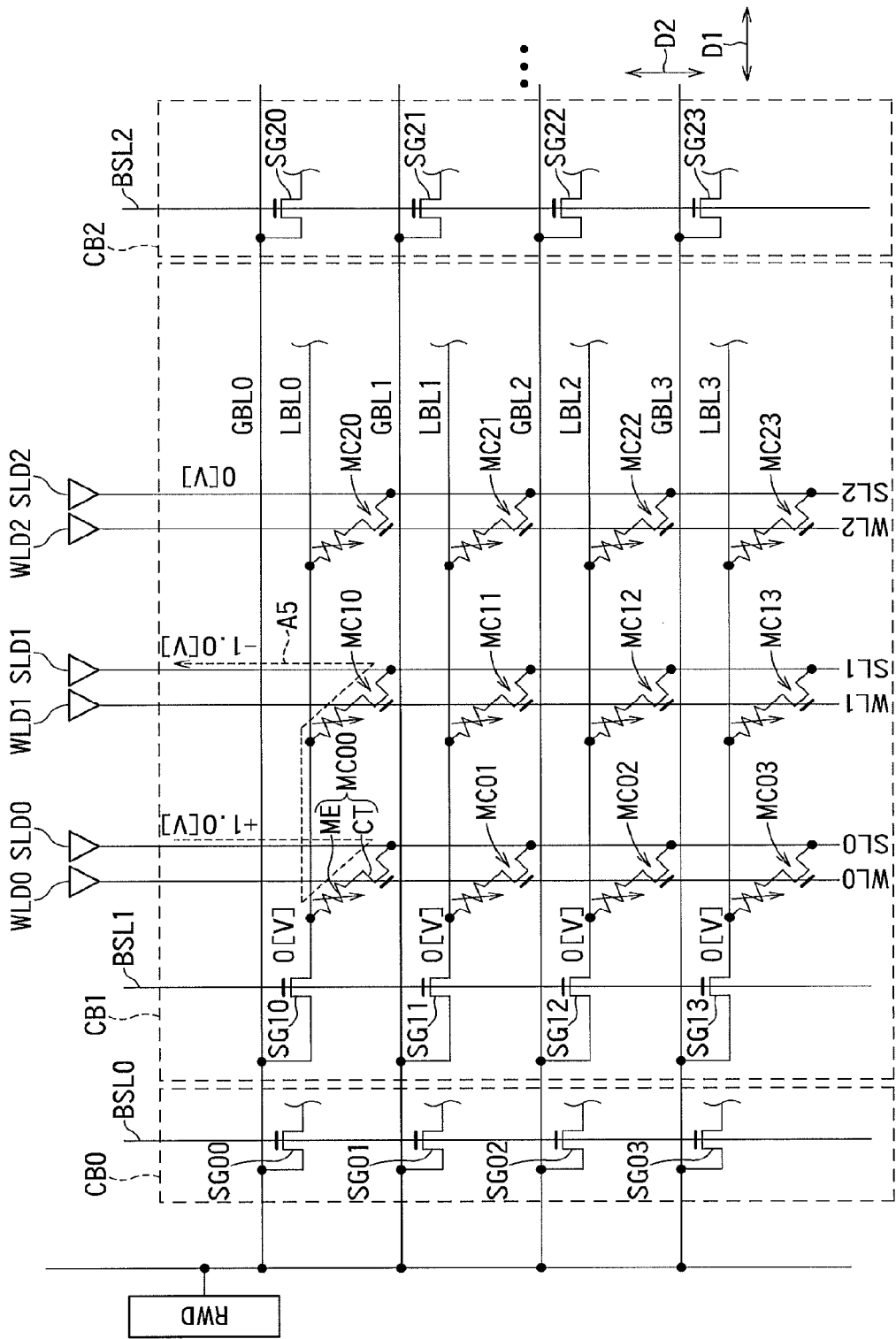
FIG. 5 shows a configuration example of the memory cell array MCA of a memory 100 and a peripheral part thereof according to a fifth embodiment.

FIG. 5 shows a configuration example of the memory cell array MCA of a memory 100 and a peripheral part thereof according to a fifth embodiment. In the fifth embodiment, the read/write driver RWD is not divided for the global bit lines GBL0 and GBL1 and for the global bit lines GBL2 and GBL3 and is shared thereby. Other configurations of the fifth embodiment can be identical to corresponding configurations of the first embodiment.

A data write operation of the memory 100 according to the fifth embodiment is explained in more detail next.

In the first embodiment, the read/write drivers RWD0 and RWD1 cause currents to flow in a pair of memory cells (MC00 and MC01, for example) adjacent in the row direction D2 via a pair of adjacent local bit lines (LBL0 and LBL1, for example), respectively.

On the other hand, in the fifth embodiment, while the 2-cell/bit system is adopted, the source line drivers SLD0 and SLD1 cause currents to flow in a pair of memory cells (MC00 and MC10, for example) adjacent in the column direction D1 via a pair of adjacent source lines (SL0 and SL1, for example), respectively. In this way, the memory 100 according to the fifth embodiment writes data to a pair of memory cells adjacent in the column direction D1.

For example, when the memory 100 writes data to the memory cells MC00 and MC10 in the cell block CB1, the block select line BSL1 is selectively driven. This connects the local bit lines LBL0 to LBL3 in the cell block CB1 to the global bit lines GBL0 to GBL3, respectively. The read/write driver RWD is connected to the global bit lines GBL0 to GBL3 and keeps the local bit lines LBL0 to LBL3 at a reference voltage (0 volt, for example).

Meanwhile, the word line driver WLD0 selectively raises the word line WL0 to connect the memory elements ME of the memory cells MC00 to MC03 to between the local bit lines LBL0 to LBL3 and the source line SL0, respectively. When the word line driver WLD1 selectively raises the word line WL1, the memory elements ME of the memory cells MC10 to MC13 are connected to between the local bit lines LBL0 to LBL3 and the source line SL1, respectively.

The source line driver SLD0 serving as a first row driver and the source line driver SLD1 serving as a second row driver apply voltages having opposite polarities and being substantially equal in the absolute values to the source line SL0 and the source line SL1, respectively. The source line driver SLD0 applies, for example, +1.0 volt to the source line SL0 and the source line driver SLD1 applies, for example, −1.0 volt to the source line SL1.

With this configuration, a write current from the source line driver SLD0 flows in the memory cell MC00 via the source line SL0 as shown by an arrow A5 in FIG. 5. The write current further flows through the memory cell MC10 via the local bit line LBL0 and then in the source line driver SLD1 via the source line SL1. That is, the source line driver SLD0 supplies a current to the memory cells MC00 and MC10 and the source line driver SLD1 receives the current having passed through the memory cells MC00 and MC10.

This flow of the write current enables a voltage to be applied to a pair of the memory cells MC00 and MC10 and the same data to be written to both of the pair of the memory cells MC00 and MC10.

Similarly, data can be written also to a pair of the memory cells MC01 and MC11, a pair of the memory cells MC02 and MC12, and to a pair of the memory cells MC03 and MC13.

According to the fifth embodiment, when data is to be written to, for example, the memory cells MC00 and MC10, voltages having opposite polarities and being substantially equal in the absolute values are applied to the source line drivers SLD0 and SLD1, respectively. That is, a voltage difference (+1.0 volt in the above example) between the source line SL0 and the local bit line LBL0 has the opposite polarity to that of a voltage difference (−1.0 volt in the above example) between the source line SL1 and the local bit line LBL0 and is substantially equal thereto in the absolute value. Therefore, the write current only passes through an interconnection portion between the memory cell MC00 and the memory cell MC10 in the local bit line LBL0.

For example, when data is to be written to the memory cells MC03 and MC13, voltages having opposite polarities and being substantially equal in the absolute values are applied to the source line drivers SLD0 and SLD1, respectively. That is, a voltage difference between the source line SL0 and the local bit line LBL3 has the opposite polarity to that of a voltage difference between the source line SL1 and the local bit line LBL3 and is substantially equal thereto in the absolute value. Therefore, the write current only passes through an interconnection portion between the memory cell MC03 and the memory cell MC13 in the local bit line LBL3.

Therefore, voltage drops or voltage increases caused by the local bit lines LBL0 and LBL3 are substantially equal between at the memory cells MC00 and MC10 and at the memory cells MC03 and MC13. The same holds true for other pairs of memory cells in the cell block CB1. That is, in the fifth embodiment, voltage drops or voltage increases caused by the local bit lines LBL0 to LBL3 are substantially uniform regardless of the positions of the memory cells in the cell block CB1.

Therefore, while there are still influences of voltage increases (voltage floating) due to interconnection resistances of the source lines SL0 to SL2, voltage increases caused by the local bit lines LBL0 to LBL3 are suppressed. The memory 100 according to the fifth embodiment thereby can reduce differences in the write voltage depending on the positions of the memory cells MC00 to MC23 in the cell blocks CB0 to CB2. As a result, the memory 100 can write data to the memory cells more reliably.

As described above, data can be written to the memory cells MC00 to MC23 regardless of the directions of current supply and voltage application to the memory cells MC00 to MC23. Therefore, the source line driver SLD1 can supply a current to the memory cells MC00 and MC10 and the source line driver SLD0 can receive the current having passed through the memory cells MC00 and MC10. Even with this configuration, the effects of the fifth embodiment are not lost.

In the fifth embodiment, the read/write driver RWD is shared by the cell blocks CB0 to CB2. However, the read/write driver RWD0 and RWD1 shown in FIG. 2 can cause currents to flow to the local bit lines LBL0 to LBL3 via the global bit lines GBL0 to GBL3, respectively, at the same time. In this manner, even with the memory 100 including the configuration shown in FIG. 2, it is possible to operate similarly as the configuration shown in FIG. 5.

Sixth Embodiment

Figure 6:
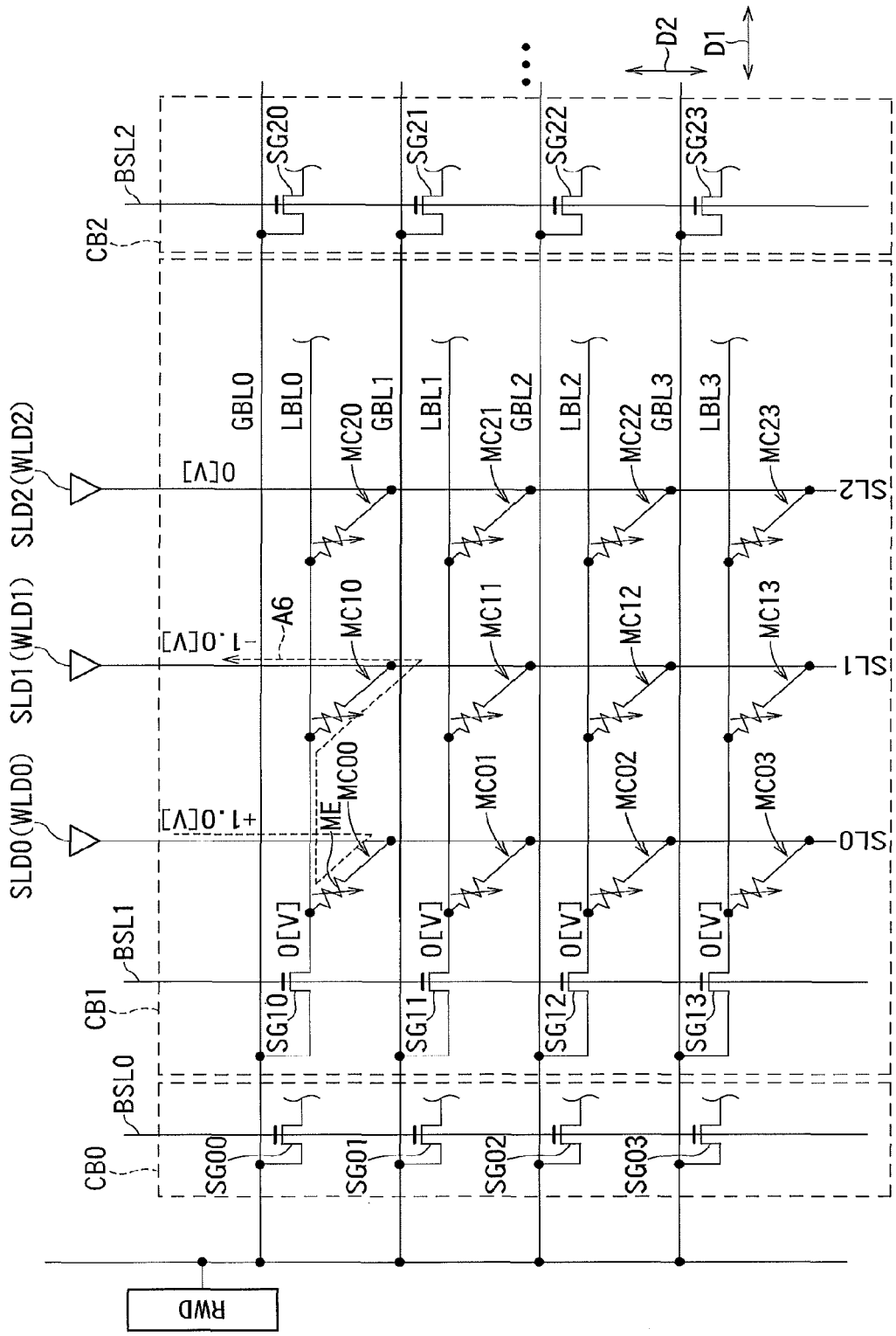
FIG. 6 shows a configuration example of the memory cell array MCA of a memory 100 and a peripheral part thereof according to a sixth embodiment.

FIG. 6 shows a configuration example of the memory cell array MCA of a memory 100 and a peripheral part thereof according to a sixth embodiment. In the sixth embodiment, the read/write driver RWD is not divided for the global bit lines GBL0 and GBL1 and for the global bit lines GBL2 and GBL3 and is shared thereby. Other configurations of the sixth embodiment can be identical to corresponding configurations of the fourth embodiment. That is, the sixth embodiment is a combination of the fourth embodiment and the fifth embodiment.

Therefore, the word lines WL0 to WL2 and the word line drivers WLD0 to WLD2 are omitted and the memory elements ME are connected directly to between the local bit lines LBL0 to LBL3 and the source lines SL0 to SL2, respectively. In the sixth embodiment, the word line drivers WLD0 to WLD2 instead of the source line drivers SLD0 to SLD2 can be connected to the source lines SL0 to SL2, respectively, and the source line drivers SLD0 to SLD2 can be omitted. The source line drivers SLD0 to SLD2 (or the word line drivers WLD0 to WLD2) selectively drive the source lines SL0 to SL2. The following explanations are given assuming that the source line drivers SLD0 to SLD2 drive the source lines SL0 to SL2.

For example, the source line driver SLD0 serving as the first row driver and the source line driver SLD1 serving as the second row driver apply voltages having opposite polarities and being substantially equal in the absolute values to the source line SL0 and the source line SL1, respectively. The source line driver SLD0 applies, for example, +1.0 volt to the source line SL0 and the source line driver SLD1 applies, for example, −1.0 volt to the source line SL1. At this time the read/write driver RWD is connected to the global bit lines GBL0 to GBL3 and keeps the local bit lines LBL0 to LBL3 at a reference voltage (0 volt, for example). The source line driver SLD2 keeps the source line SL2 at a reference voltage (0 volt, for example).

Accordingly, a write current from the source line driver SLD0 flows in the memory cells MC00 to MC03 arrayed in the row direction D2 via the source line SL0 as shown by an arrow A6 in FIG. 6. The write current further flows in the memory cells MC10 to MC13 adjacent to the memory cells MC00 to MC03 in the column direction D1 and arrayed in the row direction D2 via the local bit lines LBL0 to LBL3, respectively. The write current further flows in the source line driver SLD1 via the source line SL1. That is, the source line driver SLD0 supplies a current to the memory cells MC00 to MC03 and MC10 to MC13 and the source line driver SLD1 receives the current having passed through the memory cells MC00 to MC03 and MC10 to MC13. This enables a pair of the source line drivers SLD0 and SLD1 to simultaneously write data to pairs of memory cells (MC00, MC10), (MC01, MC11), (MC02, MC12), and (MC03, MC13) connected to a pair of the source lines SL0 and SL1.

Similarly, another pair of source line drivers also can simultaneously write data to pairs of memory cells connected to another pair of source lines.

According to the sixth embodiment, voltages having opposite polarities and being substantially equal in the absolute values are applied to the source line drivers SLD0 and SLD1, respectively. That is, a voltage difference (+1.0 volt in the above example) between the source line SL0 and the local bit lines LBL0 to LBL3 has the opposite polarity to that of a voltage difference (−1.0 volt in the above example) between the source line SL1 and the local bit lines LBL0 to LBL3 and is substantially equal thereto in the absolute value. Therefore, the write current only passes through an interconnection portion between the memory cell MC00 and the memory cell MC10 in the local bit lines LBL0 to LBL3. Therefore, the sixth embodiment can also achieve effects of the fifth embodiment.

Seventh Embodiment

Figure 7:
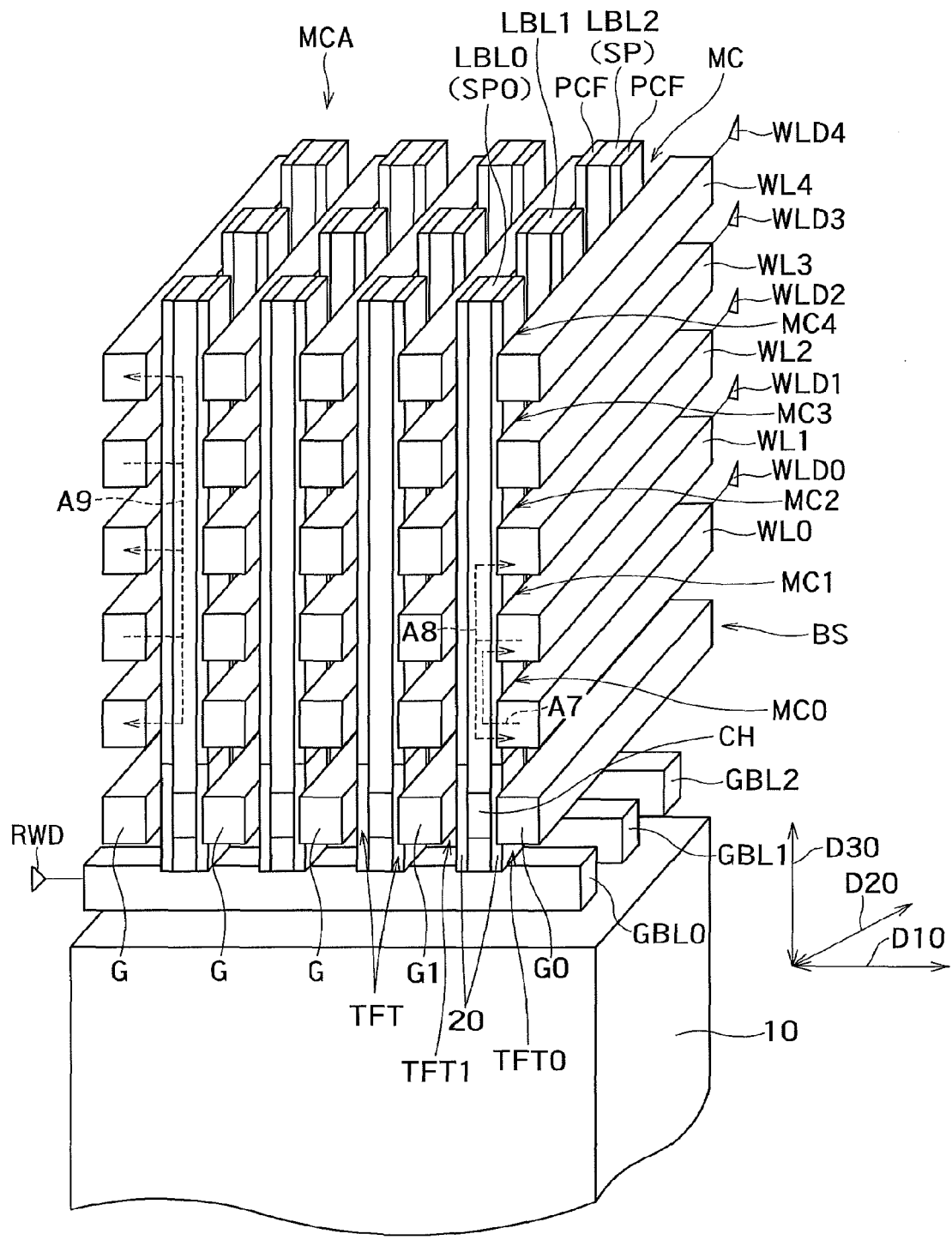
FIG. 7 is a perspective view showing an example of a configuration of a three-dimensionally stacked memory 100 according to a seventh embodiment.

FIG. 7 is a perspective view showing an example of a configuration of a three-dimensionally stacked memory 100 according to a seventh embodiment. The memory 100 includes global bit lines GBL0 to GBL2, local bit lines LBL0 to LBL2 (semiconductor pillars SP), word lines WL including word lines WL0 to WL4, block selectors BS, and phase-change films PCF. The respective numbers of the global bit lines, the local bit lines, the word lines WL, the block selectors BS, and the phase-change films PCF are not limited.

The global bit lines GBL0 to GBL2 (hereinafter, also collectively "global bit lines GBL") extend in a direction D10 and are arrayed in a direction D20 substantially orthogonal to the direction D10. That is, the global bit lines GBL0 to GBL2 are arrayed in a plan substantially parallel to a surface of a semiconductor substrate 10. An interlayer dielectric film (not shown) is filled between adjacent ones of the global bit lines GBL and the global bit lines GBL are electrically isolated from each other.

The word lines WL extend in the direction D20 (a row direction) and are arrayed in the direction D10 and a direction D30. The direction D30 (a column direction) is a direction substantially perpendicular to the surface of the semiconductor substrate 10 and is perpendicular to the directions D10 and D20. That is, the word lines WL are arrayed in a plane parallel to the surface of the semiconductor substrate 10 and are stacked in a direction perpendicular to the surface of the semiconductor substrate 10. In this way, the word lines WL are arrayed three-dimensionally (sterically). Ones of the word lines WL arrayed in the direction D30 (longitudinally) on the right end in FIG. 7 are denoted by WL0 to WL4, respectively. An interlayer dielectric film (not shown) is filled between adjacent ones of the word lines WL and the word lines WL are electrically isolated from each other.

The local bit lines LBL0 to LBL2 (hereinafter, also collectively as "local bit lines LBL") are formed of the semiconductor pillars SP (silicon pillars, for example). The semiconductor pillars SP extend in the direction D30 on the global bit lines GBL and are arranged in the directions D10 and D20 in a matrix to be located between adjacent ones of the word lines WL in the direction D10.

The phase-change films PCF (memory elements) are provided on side surfaces of each of the local bit lines LBL and are located between the local bit lines LBL and the word lines WL, respectively. The word lines WL face the opposite side surfaces of each of the local bit lines LBL with the phase-change films PCF interposed therebetween, respectively. Data can be stored by causing phase transition of a phase-change film PCF corresponding to an intersection between a word line WL and a local bit line LBL.

Each of memory cells MC is constituted by a phase-change film PCF corresponding to an intersection between a word line WL and a local bit line LBL and stores data in the phase-change film PCF. The memory cells MC are arrayed three-dimensionally in the directions D10 to D30 to constitute a memory cell array MCA. The memory cells MC are connected to between the global bit lines GBL and the word lines WL via the block selectors BS and the local bit lines LBL. With this configuration, word line drivers WLD and a page buffer PB selectively apply voltages to the memory cells MC via the word lines WL, the global bit lines GBL, and the local bit lines LBL, respectively.

Each of the block selectors BS includes a TFT (Thin Film Transistor) provided between a global bit line GBL and the memory cell array MCA. The TFTs are provided on parts of the semiconductor pillars SP near the global bit lines BL and selectively electrically connect the local bit lines LBL to the global bit lines GBL, respectively. Accordingly, each of the global bit lines GBL is connected to respective ones of ends of the corresponding local bit lines LBL via the corresponding TFTs. Each of the TFTs includes a gate G, a gate dielectric film 20, and a channel portion CH. The gates G extend in the direction D20 and are arrayed in the direction D10. That is, while arrayed in a plan parallel to the surface of the semiconductor substrate 10 similarly to the global bit lines GBL, the gates G extend in a direction substantially orthogonal to the global bit lines GBL. The gate dielectric films 20 are provided between the channel portions CH in the semiconductor pillars SP and the gates G, respectively. The gates G face the channel portions CH with the gate dielectric films 20 interposed therebetween, respectively. The channel portions CH are provided in the semiconductor pillars SP at parts near the global bit lines GBL. Because the gates G are provided on the opposite sides of each of the semiconductor pillars SP in the direction D10, the TFTs are provided on the opposite sides of each of the semiconductor pillars SP in the direction D10.

Word line drivers WLD0 to WLD4 serving as first to fourth row drivers are connected to the word lines WL0 to WL4 serving as first to fourth row power supply lines, respectively, and selectively drive the word lines WL0 to WL4. A read/write driver RWD serving as a column driver is connected to the global bit line GBL0 to GBL2 serving as column power supply lines, respectively and selectively drives the global bit lines GBL0 to GBL2.

An operation of the memory 100 according to the seventh embodiment is explained next.

When data is to be written to a pair of memory cells MC0 and MC1 adjacent in the column direction (D30), a voltage is selectively applied to a gate G0 to bring a TFT0 to an on-state. This electrically connects the local bit line LBL0 and the global bit line GBL0 to each other. In this state, the word line drivers WLD0 and WLD1 apply voltages having opposite polarities and being substantially equal in the absolute values to the word lines WL0 and WL1, respectively. The word line driver WLD0 applies, for example, +1.0 volt to the word line WL0 serving as the first row power supply line and the word line driver WLD1 applies, for example, −1.0 volt to the word line WL1 serving as the second row power supply line. Other word line drivers WLD2 to WLD4 keep the corresponding word lines WL2 to WL4 at a reference voltage (0 volt, for example), respectively. The read/write driver RWD keeps the local bit line LBL0 at a reference voltage (0 volt, for example).

Accordingly, a write current from the word line driver WLD0 flows in the memory cell MC0 via the word line WL0 as shown by an arrow A7 in FIG. 7. The write current further flows through the memory cell MC1 via the local bit line LBL0 and flows in the word line driver WLD1 via the word line WL1. That is, the word line driver WLD0 supplies a current to the memory cells MC0 and MC1 and the word line driver WLD1 receives the current having passed through the memory cells MC0 and MC1.

This flow of the write current enables a voltage to be applied to a pair of the memory cells MC0 and MC1 and the same data to be written to both of the pair of the memory cells MC0 and MC1.

When data is to be written to a pair of adjacent memory cells MC2 and MC3, it suffices that the word line drivers WLD2 and WLD3 apply voltages having opposite polarities and being substantially equal in the absolute values to the word lines WL2 and WL3, respectively.

Similarly, the memory 100 can write data to an arbitrary pair of memory cells in the memory cell array MCA by changing a pair of word line drivers to be driven or changing a local bit line to be driven.

According to the seventh embodiment, voltages having opposite polarities and being substantially equal in the absolute values are applied to a pair of word line drivers, respectively. That is, a voltage difference (+1.0 volt in the above example) between the word line WL0 and the local bit line LBL0 has the opposite polarity to that of a voltage difference (−1.0 volt in the above example) between the word line WL1 and the local bit line LBL0 and is substantially equal thereto in the absolute value. Therefore, the write current only passes through an interconnection portion between adjacent memory cells in the local bit lines LBL. Accordingly, voltage drops or voltage increases caused by the local bit lines LBL are substantially uniform regardless of the position of a pair of memory cells in the memory cell array MCA.

Therefore, while the memory 100 according to the seventh embodiment is a three-dimensionally stacked memory, voltage increases due to the local bit lines LBL are suppressed. With this configuration, the memory 100 according to the seventh embodiment can reduce differences in the write voltage depending on the position of the memory cell MC in the memory cell array MCA. As a result, the memory 100 can write data to the memory cells more reliably.

Data can be written to the memory cells MC regardless of the direction of current supply and the direction of voltage application to the memory cells MC. Therefore, the word line driver WLD1 can supply a current to a pair of memory cells and the word line driver WLD0 can receive the current having passed through the pair of memory cells. Even with this configuration, the effects of the seventh embodiment are not lost.

Eighth Embodiment

The memory 100 according to an eighth embodiment has an identical configuration to that of the three-dimensionally stacked memory shown in FIG. 7. Therefore, operations of the memory 100 according to the eighth embodiment are explained with reference to FIG. 7.

In the seventh embodiment, the word line drivers WLD apply voltages to two word lines (WL0 and WL1, for example) adjacent in the column direction (D30), respectively.

On the other hand, in the eighth embodiment, the word line drivers WLD apply voltages to a set of three word lines (WL0, WL1, and WL2, for example) arrayed adjacently in the column direction (D30), respectively. The word line driver WLD0 serving as the first row driver applies, for example, −1.0 volt to the word line WL0 serving as the first row power supply line and the word line driver WLD1 serving as the second row driver applies, for example, +1.0 volt to the word line WL1 serving as the second row power supply line. The word line driver WLD2 serving as the third row driver further applies, for example, −1.0 volt to the word line WL2 serving as a third row power supply line. Other word line drivers WLD3 and WLD4 keep the corresponding word lines WL3 and WL4 at a reference voltage (0 volt, for example). The read/write driver RWD keeps the local bit line LBL0 at a reference voltage (0 volt, for example).

With this configuration, a write current from the word line driver WLD1 flows to the memory cell MC1 via the word line WL1 arranged in the middle of the set of three word lines (WL0 to WL2) as shown by an arrow A8 in FIG. 7. The write current further flows through the two memory cells MC0 and MC2 adjacent to the memory cell MC1 on both sides thereof via the local bit line LBL0. The write current then flows in the word line drivers WLD0 and WLD2 via the two word lines WL0 and WL2, respectively. That is, the word line driver WLD1 supplies a current to the memory cells MC0 to MC2 and the two word line drivers WLD0 and WLD2 adjacent to the word line driver WLD1 on the both sides thereof receive the current having passed through the memory cells MC0 to MC2.

This flow of the write current causes a voltage to be applied to a set of three memory cells (MC0 to MC2, for example) arrayed adjacently in the direction D30 and the same data to be written to the set of three memory cells. As described above, according to the eighth embodiment, one word line driver located in the middle of three word line drivers corresponding to a set of adjacent three memory cells and two word line drivers located on the both sides of the middle word line driver apply voltages having opposite polarities and being substantially equal in the absolute values to the corresponding three word lines, respectively.

Similarly, the memory 100 can write data to an arbitrary set of memory cells in the memory cell array MCA by changing a set of word line drivers to be driven or changing a local bit line to be driven.

According to the eighth embodiment, voltages having opposite polarities and being substantially equal in the absolute values are applied to a set of word line drivers. That is, a voltage difference (+1.0 volt in the above example) between the word line WL1 and the local bit line LBL0 has the opposite polarity to that of a voltage difference (−1.0 volt in the above example) between the word lines WL0 and WL2 and the local bit line LBL0 and is substantially equal thereto in the absolute value. Therefore, the write current only passes through interconnection portions between a certain memory cell MC and two memory cells MC adjacent on the both sides thereof in the local bit lines LBL. Accordingly, voltage drops or voltage increases caused by the local bit lines LBL are substantially uniform regardless of the position of a set of memory cells in the memory cell array MCA.

Therefore, the eighth embodiment can achieve effects identical to those of the seventh embodiment. Further, according to the eighth embodiment, data can be written to three memory cells MC at the same time. Therefore, the eighth embodiment can write data with a higher rate as compared to the seventh embodiment.

Data can be written to the memory cells MC regardless of the direction of current supply and the direction of voltage application to the memory cells MC. Therefore, the word line drivers WLD0 and WLD2 can supply a current to a set of memory cells and the word line driver WLD1 can receive the current having passed through the set of memory cells. Even with this configuration, the effects of the eighth embodiment are not lost.

Ninth Embodiment

The memory 100 according to a ninth embodiment has an identical configuration to that of the three-dimensionally stacked memory shown in FIG. 7. Therefore, operations of the memory 100 according to the ninth embodiment are explained with reference to FIG. 7.

In the ninth embodiment, a pair of word line drivers (WLD0 and WLD1, for example) applies voltages to a pair of two word lines (WL0 and WL1, for example) adjacent in the column direction (D30), respectively. Pairs of word lines belonging to the same column are selected in turn in time series and data is written to memory cells connected to the selected pair of word lines.

For example, similarly to the seventh embodiment, the word line drivers WLD0 and WLD1 supply currents and voltages to a pair of adjacent word lines WL0 and WL1, respectively, to write data to the memory cells MC0 and MC1. Next, the word line drivers WLD2 and WLD3 supply currents and voltages to a pair of adjacent word lines WL2 and WL3, respectively, to write data to the memory cells MC2 and MC3. Subsequently, the word line driver WLD4 and a word line driver WLD5 (not shown) supply currents and voltages to a pair of the word line WL4 and a word line WL5 (not shown) adjacent to each other, respectively, to write data to a memory cell MC4 and a memory cell MC5 (not shown). In this way, the word line drivers WLD selectively drive a pair of word lines in turn in time series. The drive method of a pair of word lines is identical to that explained in the seventh embodiment.

In this manner, the memory 100 according to the ninth embodiment can bring all pairs of memory cells in the same column (the same block) connected to the local bit line LBL0 to the Reset state or the Set state one after another. When data is to be written to pairs of memory cells in another column, it suffices that the memory 100 changes a local bit line LBL to be connected to a global bit line GBL or changes a global bit line GBL to be driven by the read/write driver RWD by using a block selector BS. In this way, the memory 100 can bring the memory cells MC in all columns (all blocks) in the memory cell array MCA to the Reset state or the Set state in a short time.

Operations of the memory according to the ninth embodiment other than those described above can be identical to corresponding operations of the memory according to the seventh embodiment. Therefore, the ninth embodiment can also achieve effects of the seventh embodiment.

Tenth Embodiment

The memory 100 according to a tenth embodiment has an identical configuration to that of the three-dimensionally stacked memory shown in FIG. 7. Therefore, operations of the memory 100 according to the tenth embodiment are explained with reference to FIG. 7.

In the tenth embodiment, word line drivers (WLD0, WLD1, and WLD2, for example) apply voltages to a set of three word lines (WL0, WL1, and WL2, for example) arrayed adjacently in the column direction (D30). Sets of adjacent three word lines are selected from the word lines WL in turn in time series and data is written to memory cells connected to the selected set of word lines.

For example, similarly to the eighth embodiment, the word line drivers WLD0 to WLD2 supply currents and voltages to a set of adjacent three word lines WL0 to WL2, respectively, to write data to the memory cells MC0 to MC2. Next, the word line drivers WLD3 to WLD5 (not shown) supply currents and voltages to a set of adjacent three word lines WL3 to WL5 (not shown), respectively, to write data to the memory cells MC3 to MC5 (not shown). In this manner, the word line drivers WLD selectively drive a set of three word lines in turn in time series. The drive method of a set of three word lines is identical to that explained in the eighth embodiment.

In this way, the memory 100 according to the tenth embodiment can bring all pairs of memory cells in the same column (the same block) connected to the local bit line LBL0 to the Reset state or the Set state one after another. When data is to be written to pairs of memory cells in another column, it suffices that the memory 100 changes a local bit line LBL to be connected to a global bit line GBL or changes a global bit line GBL to be driven by the read/write driver RWD by using a block selector BS. This enables the memory 100 to bring the memory cells MC in all columns (all blocks) in the memory cell array MCA to the Reset state or the Set state in a short time.

Operations of the memory according to the tenth embodiment other than those described above can be identical to corresponding operations of the memory according to the eighth embodiment. Therefore, the tenth embodiment can also achieve effects of the eighth embodiment.

Eleventh Embodiment

The memory 100 according to an eleventh embodiment has an identical configuration to that of the three-dimensionally stacked memory shown in FIG. 7. Therefore, operations of the memory 100 according to the eleventh embodiment are explained with reference to FIG. 7.

In the eleventh embodiment, the word lines WL0 to WL4 corresponding to a certain local bit line, LBL0 in this case, are selected at the same time and a positive voltage and a negative voltage are alternately applied thereto, respectively, in the order of array. For example, a negative voltage, a positive voltage, a negative voltage, a positive voltage, and a negative voltage are applied to the word lines WL0, WL1, WL2, WL3, and WL4, respectively. With this configuration, the memory 100 writes data to a plurality of memory cells MC connected to the word lines WL0 to WL4 at the same time.

For example, when the word line drivers WLD0 to WLD4 apply a negative voltage, a positive voltage, a negative voltage, a positive voltage, and a negative voltage to the word lines WL0 to WL4, respectively, write currents from the word line drivers WLD1 and WLD3 flow in the memory cells MC1 and MC3 via the word lines WL1 and WL3, respectively. The write currents further flow in two memory cells MC0 and MC2 adjacent to the memory cell MC1 on the both sides and in two memory cells MC2 and MC4 adjacent to the memory cell MC3 on the both sides via the local bit line LBL0, respectively. The write currents further flow in the word line drivers WLD0, WLD2, and WLD4 via three word lines WL0, WL2, and WL4, respectively (see an arrow A9 in FIG. 7). That is, the word line drivers WLD1 and WLD3 supply currents to the memory cells MC0 to MC4 and the word line drivers WLD0, WLD2, and WLD4 adjacent to the word line drivers WLD1 and WLD3 on the both sides receive the currents having passed through the memory cells MC0 to MC4.

With this configuration, the word line drivers WLD0 to WLD4 simultaneously drive the word lines WL0 to WL4. With this configuration, the memory 100 can simultaneously bring all pairs of memory cells in the same column connected to the local bit line LBL0 to the Reset state or the Set state. In this way, the memory 100 can bring the memory cells MC in all columns in the memory cell array MCA to the Reset state or the Set state in a short time.

Operations of the memory according to the eleventh embodiment other than those described above can be identical to corresponding operations of the memory according to the eighth embodiment. Therefore, the eleventh embodiment can also achieve effects of the eighth embodiment.

Twelfth Embodiment

Figure 8:
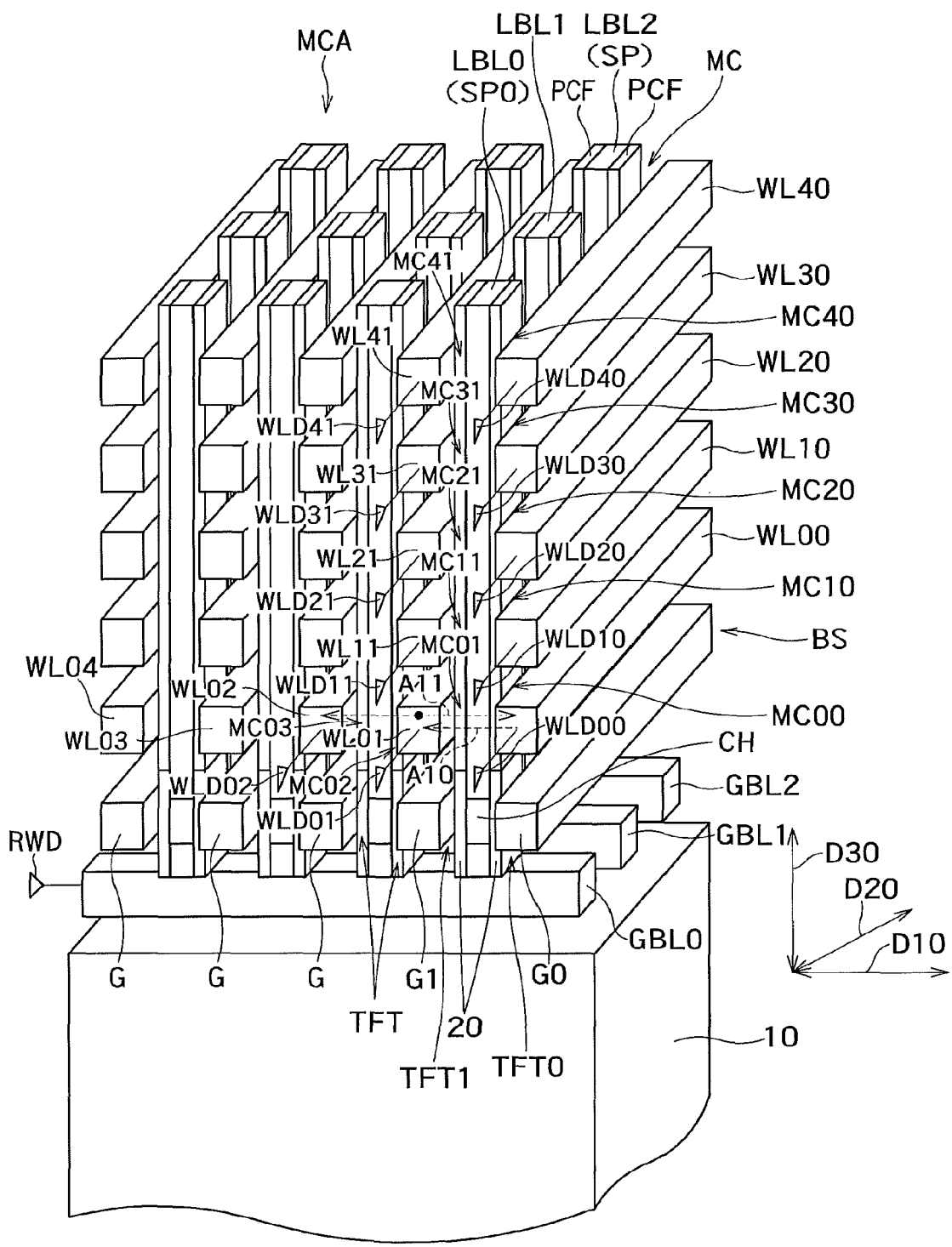
FIG. 8 is a perspective view showing an example of a configuration of a three-dimensionally stacked memory 100 according to a twelfth embodiment.

FIG. 8 is a perspective view showing an example of a configuration of a three-dimensionally stacked memory 100 according to a twelfth embodiment. The memory 100 according to the twelfth embodiment has an identical configuration to that of the three-dimensionally stacked memory shown in FIG. 7.

The memories 100 according to the seventh to eleventh embodiments selectively drive a plurality of word lines WL adjacent in the column direction (D30).

On the other hand, the memory 100 according to the twelfth embodiment selectively drives a plurality of word lines WL adjacent in the direction D10 (a direction perpendicular to the extension directions of the word lines WL and the local bit lines LBL) at the time of data write.

Memory cells MC01, MC11, MC21, MC31, and MC41 are adjacent to memory cells MC00, MC10, MC20, MC30, and MC40 in the direction D10 across the local bit line LBL0, respectively. The word lines WL01, WL11, WL21, WL31, and WL41 are adjacent to the word lines WL00, WL10, WL20, WL30, and WL40 in the direction D10 across the local bit line LBL0, respectively. The word lines WL01, WL11, WL21, WL31, and WL41 are driven by word line drivers WLD01, WLD11, WLD21, WLD31, and WLD41, respectively.

For example, when data is to be written to a pair of the memory cells MC00 and MC01 adjacent in the direction D10, the local bit line LBL0 and the global bit line GBL0 are electrically connected to each other. Next, the word line drivers WLD00 and WLD01 apply voltages having opposite polarities and being substantially equal in the absolute values to the word lines WL00 and WL01, respectively. The word line driver WLD00 applies, for example, +1.0 volt to the word line WL00 serving as the first row power supply line and the word line driver WLD01 applies, for example, −1.0 volt to the word line WL01 serving as the second row power supply line. Other word line drivers WLD10 to WLD40 and WLD11 to WLD41 keep the corresponding word lines WL10 to WL40 and WL11 to WL41 at a reference voltage (0 volt, for example). The read/write driver RWD keeps the local bit line LBL0 at a reference voltage (0 volt, for example).

This causes a write current from the word line driver WLD00 to flow in the memory cell MC00 via the word line WL00 as shown by an arrow A10 in FIG. 8. The write current further flows through the memory cell MC01 via the local bit line LBL0 into the word line driver WLD01 via the word line WL01. That is, the word line driver WLD00 supplies a current to the memory cells MC00 and MC01 adjacent in the direction D10 and the word line driver WLD01 receives the current having passed through the memory cells MC00 and MC01.

This flow of the write current causes a voltage to be applied to a pair of the memory cells MC00 and MC01 and the same data to be written to both of the pair of the memory cells MC00 and MC01.

When data is to be written to a pair of the memory cells MC10 and MC11 adjacent in the direction D10, it suffices that the word line drivers WLD10 and WLD11 apply voltages having opposite polarities and being substantially equal in the absolute values to the word lines WL10 and WL11, respectively.

Similarly, the memory 100 can write data to an arbitrary pair of memory cells in the memory cell array MCA by changing a pair of word line drivers to be driven or changing a local bit line to be driven.

According to the twelfth embodiment, voltages having opposite polarities and being substantially equal in the absolute values are applied to a pair of word line drivers, respectively. That is, a voltage difference (+1.0 volt in the above example) between the word line WL00 and the local bit line LBL0 has the opposite polarity to that of a voltage difference (−1.0 volt in the above example) between the word line WL01 and the local bit line LBL0 and is substantially equal thereto in the absolute value. Therefore, the twelfth embodiment can achieve effects identical to those of the seventh embodiment.

Data can be written to the memory cells MC regardless of the directions of current supply and voltage application to the memory cells MC. Therefore, the word line driver WLD01 can supply a current to a pair of memory cells MC and the word line driver WLD00 can receive the current having passed through the pair of memory cells MC. Even with this configuration, the effects of the twelfth embodiment are not lost.

Thirteenth Embodiment

The memory 100 according to a thirteenth embodiment has an identical configuration to that of the three-dimensionally stacked memory shown in FIG. 8. Therefore, operations of the memory 100 according to the thirteenth embodiment are explained with reference to FIG. 8.

In the thirteenth embodiment, pairs of word lines WL provided along one of the local bit lines LBL and being adjacent in the direction D10 are selected in turn in time series in the direction D30. Data is written to memory cells MC connected to the selected pair of word lines WL.

For example, a pair of the word lines WL00 and WL01 is first selected to write data to the memory cells MC00 and MC01. The write operation can be identical to that according to the twelfth embodiment. Next, a pair of the word lines WL10 and WL11 is selected to write data to the memory cells MC10 and MC11. Similarly, pairs of word lines WL (WL20, WL21), (WL30, WL31), and (WL40, WL41) are selected in turn in time series to write data to memory cells (MC20 MC21), (MC30, MC31), and (MC40, MC41).

The memory 100 according to the thirteenth embodiment can bring all pairs of memory cells in the same column connected to the local bit line LBL0 to the Reset state or the Set state one after another. When data is to be written to pairs of memory cells in another column, it suffices that the memory 100 changes a connection relation between a global bit line GBL and a local bit line LBL. Accordingly, the memory 100 can bring the memory cells MC in the memory cell array MCA to the Reset state or the Set state in a short time.

Operations of the thirteenth embodiment other than those described above can be identical to corresponding operations of the twelfth embodiment. Therefore, the thirteenth embodiment can also achieve effects of the twelfth embodiment.

Fourteenth Embodiment

In a fourteenth embodiment, pairs of word lines WL provided along one of the local bit lines, LBL0 in this case, and being adjacent in the direction D10 in FIG. 8 are simultaneously selected. Data is written to memory cells MC connected to the selected pairs of word lines WL. The configuration of the fourteenth embodiment can be identical to the configuration of the twelfth embodiment.

For example, pairs of word lines WL (WL00, WL01), (WL10, WL11), (WL20, WL21), (WL30, WL31), and (WL40, WL41) provided along the local bit line LBL0 are all selected. This enables data to be written to the memory cells MC00 to MC41. The write operation to each pair of word lines WL can be identical to that according to the twelfth embodiment.

The memory 100 according to the fourteenth embodiment can bring memory cells in the same column connected to the local bit line LBL0 to the Reset state or the Set state at the same time. When data is to be written to memory cells in another column, it suffices that the memory 100 changes the connection relation between a global bit line GBL and a local bit line LBL. In this way, the memory 100 can bring the memory cells MC in the memory cell array MCA to the Reset state or the Set state in a short time.

Operations of the fourteenth embodiment other than those described above can be identical to corresponding operations of the twelfth embodiment. Therefore, the fourteenth embodiment can also achieve effects of the twelfth embodiment.

Fifteenth Embodiment

The memory 100 according to a fifteenth embodiment has an identical configuration to that shown in FIG. 8. Therefore, operations of the memory 100 according to the fifteenth embodiment are explained with reference to FIG. 8.

In the fifteenth embodiment, the word line drivers (WLD00, WLD01, and WLD02, for example) apply voltages to a set of three word lines (WL00, WL01, and WL02, for example) arrayed adjacently in the direction D10, respectively. The word line drivers WLD further select each set of adjacent three word lines in turn in time series or at the same time to write data to memory cells connected to the selected set of word lines.

For example, the word line drivers WLD00 to WLD02 supply currents and voltages to a set of three word lines WL00 to WL02 adjacent in the direction D10, respectively, to write data to the memory cells MC00 to MC03.

At this time, the word line driver WLD00 applies +1.0 volt to the word line WL00 and the word line drivers WLD01 and WLD02 apply −1.0 volt to the word lines WL01 and WL02, respectively. Other word line drivers WLD keep the corresponding word lines WL at a reference voltage (0 volt, for example). The read/write driver RWD is in a floating state without applying a voltage. Alternatively, the read/write driver RWD can keep the local bit line LBL0 at a reference voltage (0 volt for example) to suppress occurrence of noise.

Accordingly, a write current from the word line drive WLD01 flows in the memory cells MC01 and MC02 via the word line WL01 arranged in the middle of the set of three word line (WL00 to WL02) as shown by an arrow A11 in FIG. 8. The write current further flows through two memory cells MC00 and MC03 via two local bit lines LBL located on the both sides of the word line WL01 and flows in the word line drivers WLD00 and WLD02 via two word lines WL00 and WL02, respectively. That is, the word line driver WLD01 supplies a current to the memory cells MC00 to MC03 and the two word line drivers WLD00 and WLD02 adjacent to the word line driver WLD01 on the both sides receive the current having passed through the memory cells MC00 to MC03

According to the fifteenth embodiment, voltages having opposite polarities and being substantially equal in the absolute values are applied to a set of word line drivers. That is, a voltage difference (+1.0 volt in the above example) between the word line WL01 and the local bit line LBL0 has the opposite polarity to that of a voltage difference (−1.0 volt in the above example) between the word lines WL00 and WL02 and the local bit line LBL0 and in substantially equal thereto in the absolute value. Therefore, the write current only passes through interconnection portions between a certain word line and two word lines adjacent thereto on the both sides in the local bit lines LBL. Accordingly, voltage drops or voltage increases caused by the local bit lines LBL are substantially uniform regardless of the position of a set of memory cells in the memory cell array MCA.

Therefore, the fifteenth embodiment can achieve effects identical to those of the twelfth embodiment. According to the fifteenth embodiment, data can be written to four memory cells MC (MC00 to MC03, for example) at the same time. Therefore, the fifteenth embodiment can write data with a higher rate as compared to the twelfth embodiment.

A word line (a fourth row power supply line) WL03 adjacent to the selected set of three word lines (the first to third row power supply lines (WL00 to WL02)) can be at an intermediate voltage between the voltage of the word line WL02 adjacent to the word line WL03 on one side and the voltage of a word line (a fifth row power supply line) WL04 adjacent thereto on the other side. For example, when the voltage of the word line WL02 is −1.0 volt and the voltage of the word line WL04 is 0 volt, the voltage of the word line WL03 is set to an intermediate voltage (−0.5 volt, for example) between the voltage of the word line WL02 and the voltage of the word line WL04.

When the voltage of the word line WL03 is 0 volt, voltages to be applied to two phase-change films PCF located between the word line WL02 (−1.0 volt) and the word line WL03 are 0.5 volt, respectively.

Meanwhile, when the voltage of the word line WL03 is −0.5 volt, voltages to be applied to the two phase-change films PCF located between the word lines WL02 and WL03 are 0.25 volt, respectively. Accordingly, the voltages applied to the phase-change films PCF can be reduced and erroneous write can be suppressed.

While an example of the reference voltage is 0 volt in the above embodiments, the reference voltage is not necessarily 0 volt. In the case where the reference voltage is not 0 volt, it suffices that a pair of selected local bit lines or a pair of selected word lines are at opposite voltages of the reference voltage, respectively.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a plurality of column power supply lines;
   a plurality of row power supply lines;
   a plurality of resistance-change memory cells connected to the column power supply lines and the row power supply lines, respectively;
   a first column driver supplying a current to a first column power supply line among the column power supply lines; and
   a second column driver supplying a current to a second column power supply line among the column power supply lines, wherein
   the first and second column drivers apply voltages having opposite polarities to the first and second column power supply lines, respectively, in a data write operation, and
   one of the first and second column drivers supplies a current to relevant ones of the memory cells and other thereof receives the current having passed through the memory cells.

2. The device of claim 1, wherein the first column power supply line is adjacent to the second column power supply line.

3. The device of claim 1, wherein
   a current flows from the first column power supply line to the second column power supply line via relevant ones of the memory cells and relevant one of the row power supply lines or flows from the second column power supply line to the first column power supply line via the relevant ones of the memory cells and the relevant one of the row power supply lines in a data write operation, and
   a voltage difference between the first column power supply line and the row power supply line has an opposite polarity to that of a voltage difference between the second column power supply line and the row power supply line and is substantially equal thereto in an absolute value.

4. The device of claim 1, further comprising a row driver applying a voltage to any one of the row power supply lines, wherein
   the row driver selects the row power supply lines in turn in time series to write data to the memory cells connected to the first and second column power supply lines in turn in a data write operation.

5. The device of claim 1, further comprising a row driver applying a voltage to any one of the row power supply lines, wherein
   the row driver simultaneously selects the row power supply lines to simultaneously write data to the memory cells connected to the first and second column power supply lines in a data write operation.

6. The device of claim 1, wherein the memory cells are phase-change memories (PCMs) or interfacial phase-change memories (iPCMs).

7. A semiconductor storage device comprising:
   a plurality of column power supply lines;
   a plurality of row power supply lines;
   a plurality of resistance-change memory cells connected to the column power supply lines and the row power supply lines, respectively;
   a first row driver supplying a current to a first row power supply line among the row power supply lines; and
   a second row driver supplying a current to a second row power supply line among the row power supply lines, wherein
   the first and second row drivers apply voltages having opposite polarities to the first and second row power supply lines, respectively, in a data write operation, and
   one of the first and second row drivers supplies a current and other thereof receives the current.

8. The device of claim 7, wherein the first row power supply line is adjacent to the second row power supply line.

9. The device of claim 7, wherein
a current flows from the first row power supply line to the second row power supply line via relevant ones of the memory cells and relevant one of the column power supply lines or flows from the second row power supply line to the first row power supply line via the relevant ones of the memory cells and the relevant one of the column power supply lines in a data write operation, and
a voltage difference between the first row power supply line and the column power supply line has an opposite polarity to that of a voltage difference between the second row power supply line and the column power supply line and is substantially equal thereto in an absolute value.

10. The device of claim 7, further comprising a third row driver supplying a current to a third row power supply line among the row power supply lines, wherein
the first to third row power supply lines are arrayed adjacently in an order of the first row power supply line, the second row power supply line, and the third row power supply line,
the second row driver applies a voltage to the second row power supply line while the first and third row drivers applying voltages having an opposite polarity to that of the voltage of the second row driver to the first and third row power supply lines, respectively, in a data write operation, and
the second row driver supplies a current and the first and third row drivers receive the current.

11. The device of claim 7, wherein pairs of adjacent ones of the row power supply lines are selected in turn in time series, and data is written to ones of the memory cells connected to the selected pair of the row power supply lines in a data write operation.

12. The device of claim 10, wherein sets of adjacent three of the row power supply lines are selected in turn in time series, and data is written to ones of the memory cells connected to the selected three of the row power supply lines in a data write operation.

13. The device of claim 7, wherein the row power supply lines are simultaneously selected, a positive voltage and a negative voltage are applied to the row power supply lines alternately in an array order, and data is written to the memory cells connected to the row power supply lines in a data write operation.

14. The device of claim 7, wherein the memory cells are phase-change memories (PCMs) or interfacial phase-change memories (iPCMs).

15. The device of claim 7, wherein
the column power supply lines extend in a direction substantially perpendicular to a surface of a semiconductor substrate,
phase-change films of the memory cells are located on side surfaces of the column power supply lines,
the row power supply lines face the side surfaces of the column power supply lines across the phase-change films, respectively, and are three-dimensionally arrayed in a direction substantially parallel to the surface of the semiconductor substrate and in a direction substantially perpendicular thereto,
the memory cells are located to correspond to intersections between the column power supply lines and row power supply lines, respectively, and
the column power supply lines are connected to the semiconductor substrate via select gates, respectively.

16. The device of claim 15, wherein
the first row power supply line is adjacent to the second row power supply line in a direction substantially parallel to the surface of the semiconductor substrate, and
a current flows between the first row power supply line and the second row power supply line via one of the column power supply lines in a data write operation.

17. The device of claim 15, further comprising a third row driver supplying a current to a third row power supply line among the row power supply lines, wherein
the first to third row power supply lines are arrayed adjacently to the second row power supply line in a direction substantially parallel to the surface of the semiconductor substrate in an order of the first row power supply line, the second row power supply line, and the third row power supply line,
the second row driver applies a voltage to the second row power supply line while the first and third row drivers applying voltages having an opposite polarity to that of the voltage of the second row driver to the first and third row power supply lines, respectively, in a data write operation, and
the second row driver supplies a current and the first and third row drivers receive the current.

18. The device of claim 15, wherein ones of the row power supply lines arranged along one of the column power supply lines are selected in turn in time series in a direction substantially perpendicular to the surface of the semiconductor substrate and data is written to one of the memory cells connected to the selected row power supply lines in a data write operation.

19. The device of claim 15, wherein a plurality of the row power supply lines arranged along one of the column power supply lines are simultaneously selected and data is written to ones of the memory cells connected to the selected row power supply lines in a data write operation.

20. The device of claim 17, further comprising:
a fourth row power supply line arrayed adjacently to the third row power supply line in a direction substantially parallel to the surface of the semiconductor substrate; and
a fifth row power supply line arrayed adjacently to the fourth row power supply line in a direction substantially parallel to the surface of the semiconductor substrate, wherein
when the second row driver applies a voltage to the second row power supply line and the first and third row drivers apply voltages having an opposite polarity to that of the voltage of the second row driver to the first and third row power supply lines, respectively, a voltage of the fourth row power supply line is set to an intermediate voltage between the voltage of the third row power supply line and a voltage of the fifth row power supply line.

* * * * *